(12) United States Patent
Foad et al.

(10) Patent No.: US 6,501,081 B1
(45) Date of Patent: Dec. 31, 2002

(54) ELECTRON FLOOD APPARATUS FOR NEUTRALIZING CHARGE BUILD UP ON A SUBSTRATE DURING ION IMPLANTATION

(75) Inventors: Majeed Foad, Sunnyvale, CA (US); Yashuhiko Matsunaga, Chiba (JP)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/462,173
(22) PCT Filed: Jul. 1, 1998
(86) PCT No.: PCT/GB98/01930
  § 371 (c)(1),
  (2), (4) Date: May 8, 2000
(87) PCT Pub. No.: WO99/01885
  PCT Pub. Date: Jan. 14, 1999

(30) Foreign Application Priority Data

Jul. 3, 1997 (GB) .............................................. 9714094

(51) Int. Cl.[7] .......................... H01J 37/02; H01J 37/317
(52) U.S. Cl. ................................... 250/492.21; 250/251
(58) Field of Search ........................... 250/492.21, 251, 250/492.2

(56) References Cited

U.S. PATENT DOCUMENTS

| 4,939,360 A | 7/1990 | Sakai | 250/251 |
| 5,089,710 A | 2/1992 | Kikuchi et al. | 250/492.3 |
| 5,399,871 A | 3/1995 | Ito et al. | 250/492.21 |
| 5,466,929 A | 11/1995 | Sakai et al. | 250/251 |

FOREIGN PATENT DOCUMENTS

| EP | 0416549 A2 | 3/1991 |
| EP | 0468521 A2 | 1/1992 |

OTHER PUBLICATIONS

S. Cherekdjian et al., "Plasma flood Guns—NV10, PI9000—Old Machine, new retrofit," Ion Implantation Technology—94, pp. 608–611.

Primary Examiner—Jack Berman
(74) Attorney, Agent, or Firm—Boult Wade Tennant

(57) ABSTRACT

An electron flood apparatus for neutralizing positive charge build up on a substrate during ion implantation comprises a tube through which the ion beam passes to the substrate. Inert gas is supplied to the plasma chamber and a cathode in the plasma chamber is heated to emit electrons. An accelerating electrical supply is connected between a cathode and an accelerating electrode in the plasma chamber to accelerate electrons emitted by the cathode to produce a plasma in the chamber. A separate cathode bias electrical supply is connected directly between the cathode and the substrate common terminal to set a desired bias potential on the cathode relative to the substrate independently of the acceleration potential.

9 Claims, 4 Drawing Sheets

ELECTRON FLOOD APPARATUS FOR NEUTRALIZING CHARGE BUILD UP ON A SUBSTRATE DURING ION IMPLANTATION

This application is the national phase under 35 U.S.C. § 371 of PCT International Application No. PCT/GB98/01930 which has an International filing date of Jul. 1, 1998, which designated the United States of America.

The present invention relates to electron flood apparatus for neutralising positive charge build up on a substrate during implantation of ions in the substrate by ion beam implantation apparatus.

In the manufacture of semiconductor devices, an increasingly popular processing technology is ion beam implantation whereby a beam of desired impurity ions is directed at the semiconductor substrate so that the ions become implanted in the substrate to create regions of a desired conductivity type, for example. Some regions of the substrate being implanted will be electrically insulated from the main body of the semiconductor substrate. As a result during implantation with ions, such regions become progressively charged. Usually the implanted ions are positive so that positive charge build up on the substrate surface occurs. If this charge build up exceeds the breakdown voltage of insulated layers and regions in the substrate, damage is caused.

There is thus a known requirement to neutralise charge build up on the surface of substrates during ion implantation.

Known techniques for neutralising this charge build up involve flooding the region of the ion beam immediately in front of the substrate with electrons. Any positive charge build up on a substrate tends to attract these electrons to the substrate surface to discharge the surface. Examples of electron flood apparatus, also known as plasma flood guns, are disclosed in U.S. Pat. Nos. 5,089,710 and 5,399,871. In order to be effective, these electron flood systems used for substrate neutralisation, must produce relatively low energy electrons, which can then readily be attracted to the substrate by relatively small positive charges arising on the substrate. Further, excessively energetic electrons in front of the substrate can impinge upon and "stick" to the substrate surface even though any positive charge on the substrate surface has already been fully discharged, and thereby build up an excess negative electrostatic charge on the surface. The degree to which such a negative electrostatic charge can accumulate on the substrate surface is related to the energy of the electrons in the region in front of the substrate.

In known ion beam implantation apparatus, the substrate, typically a semiconductor wafer, is mounted on a holder which is in turn connected to a common terminal. In the arrangements illustrated in the above two U.S. patent specifications, this substrate common terminal is connected to ground. In each of these U.S. specifications, the electron flood apparatus comprises a tube for axially receiving and passing an ion beam to the substrate. A plasma chamber has an exit aperture which communicates with an opening in the side of the tube. Inert gas is supplied to the plasma chamber. A cathode in the plasma chamber is heated from a cathode power supply to emit electrons. The plasma chamber is made electrically conducting and thereby provides an accelerating electrode. An electrical supply is connected to provide an accelerating potential between the cathode and the accelerating electrode formed by the plasma chamber. As a result, electrons emitted by the cathode are accelerated to produce a plasma in the chamber. The cathode is a directly heated filament.

In U.S. Pat. No. 5,089,710, the plasma chamber itself is either connected directly, or biased negatively relative, to the tube surrounding the ion beam in front of the substrate. As a result, electrons from the plasma in the plasma chamber entering the tube of this U.S. specification have an energy of at least the acceleration bias potential between the filament and the plasma chamber walls.

In U.S. Pat. No. '710, the tube surrounding the beam in front of the substrate acts as a Faraday intended for measuring the total beam current impinging on the substrate. As such, the Faraday tube may be positively biased relative to the grounded substrate common terminal, since the Faraday tube must function to absorb all secondary electrons emitted by the substrate during ion bombardment. In U.S. Pat. No. '710, the positive bias on the Faraday tube is adjustable. This positive bias has the effect of reducing the energy on the substrate of flood electrons generated in the plasma chamber of the flood source. However, the positive bias also tends to attract these electrons within the Faraday tube, thereby reducing the number of flood electrons available for charge neutralisation on the substrate. Thus, the system disclosed in U.S. Pat. No. '710 may provide inadequate numbers of flood electrons to ensure proper neutralisation of positive charge build up on the substrate, when the energy of flood electrons at the substrate is reduced sufficiently to prevent unwanted negative charge build up on other regions of the substrate.

Referring, by comparison, to U.S. Pat. No. 5,399,871, here the filament in the plasma chamber is connected to ground, as is the support for the substrate. The tube surrounding the beam in front of the substrate is biased negatively and acts only as an electron confinement tube to encourage flood electrons emitted into the tube from the plasma chamber to diffuse to the ion beam region which generally has a small positive potential.

With such an arrangement as shown in the drawings of U.S. Pat. No. '871, the flood electrons can have a very low energy at the substrate, typically no more than about 5 volts, if the filament supply is 5 volts. However, the current of flood electrons emitted from the plasma chamber into the tube is also relatively low and may not be sufficient in some circumstances to neutralise adequately positive charge build up on the substrate.

It is also known to use the arrangement disclosed in U.S. Pat. No. '871 with the plasma chamber itself connected to ground. The acceleration bias between the plasma chamber and the filament, then also serves to bias the filament relative to ground. This can substantially increase the current of electrons entering the confinement tube from the plasma chamber, but also increases the energy of these electrons at the substrate, thereby increasing the risk of negative charging.

The present invention provides electron flood apparatus for neutralising positive charge build up on the substrate during implantation of ions in the substrate by ion implantation apparatus, the substrate being connected to a common terminal, the electron flood apparatus comprising a tube for axially receiving and passing an ion beam to a substrate, an opening in a side wall of the tube, a plasma chamber having an exit aperture in communication with said opening of said tube, a supply of inert gas to said plasma chamber, a cathode in said plasma chamber, a cathode power supply connected to heat said cathode to emit electrons, said plasma chamber providing an accelerating electrode within said chamber, an accelerating electrical supply connected to provide an accelerating potential between said cathode and said accelerating electrode to accelerate electrons emitted by said cathode to produce a plasma in said chamber, and a cathode bias electrical supply for connection directly between said cathode and said substrate common terminal to set a desired bias potential on said cathode relative to said substrate independently of said accelerating potential.

With this arrangement a cathode bias supply is provided in addition to the accelerating supply (also called arc supply), so that the potential of the cathode in the plasma chamber can be set relative to the substrate common terminal independently of the arc supply. This provides substantial advantages in many applications where the previously known modes of operation provided either an inadequate flux of electrons of sufficiently low energy, or an adequate flux of excessively energetic electrons. By adjusting the cathode bias supply to provide a corresponding bias potential on the cathode, a sufficient flux of electrons can be provided to prevent excess positive charging on the substrate, without producing unwanted negative charging resulting from excessively energetic electrons.

Normally, the cathode comprises a filament and said cathode power supply is a filament power supply connected directly across said filament.

The cathode bias supply (which can be regarded as a filament bias supply when the cathode is a directly heated filament) may be adjustable to set a value of said desired cathode bias potential between zero and minus fifty volts (preferably between zero and minus thirty volts).

In one embodiment, the accelerating supply is adjustable to set a value for said accelerating potential between 20 and 40 volts. The apparatus may provide in addition a tube bias electrical supply for connection between said tube and said substrate common terminal to set a desired bias potential on said tube relative to said substrate. This tube bias supply may be adjustable to set a value of said desired tube bias tube potential between zero and minus thirty volts.

Referring again to U.S. Pat. No. 5,399,871, permanent magnets are provided around the plasma chamber to provide a magnetic field in the plasma chamber substantially aligned with the axis of the exit aperture of the chamber. This field has the effect of concentrating the plasma within the plasma chamber thereby increasing the number of electrons produced in the chamber and enhancing the flow of electrons through the exit aperture. Thus the arrangement disclosed in U.S. Pat. No. '871 includes magnet apparatus to produce a magnetic field in said plasma chamber having field lines in a central region of said chamber aligned with said exit aperture co increase the density of plasma in said chamber and promote the flow of electrons from said chamber through said exit aperture.

The present invention may also provide electron flood apparatus of the kind known from U.S. Pat. No. '871 wherein said magnet apparatus comprises a solenoid coil surrounding said plasma chamber coaxially with said exit aperture and a solenoid power supply to energise said coil to produce said magnetic field.

Replacing the permanent magnet by a suitably positioned solenoid around the plasma chamber has surprising beneficial effects. By ensuring a magnetic flux density in the centre of the plasma chamber of at least 250 gauss and preferably at least 300 gauss, the flux of electrons from the plasma chamber into the tube surrounding the beam in front of the substrate can be increased from as low as 50 mA or less to several hundred mA without increasing the bias on the filament in the plasma chamber. As a result, by using a solenoid to produce the magnet field in the plasma chamber, a remarkable increase in electron flux is obtained without the need to increase bias voltage, and so without increasing the energy of the electrons at the substrate.

Examples of the invention will now be described with reference to the accompanying drawings in which.

Figure 1:
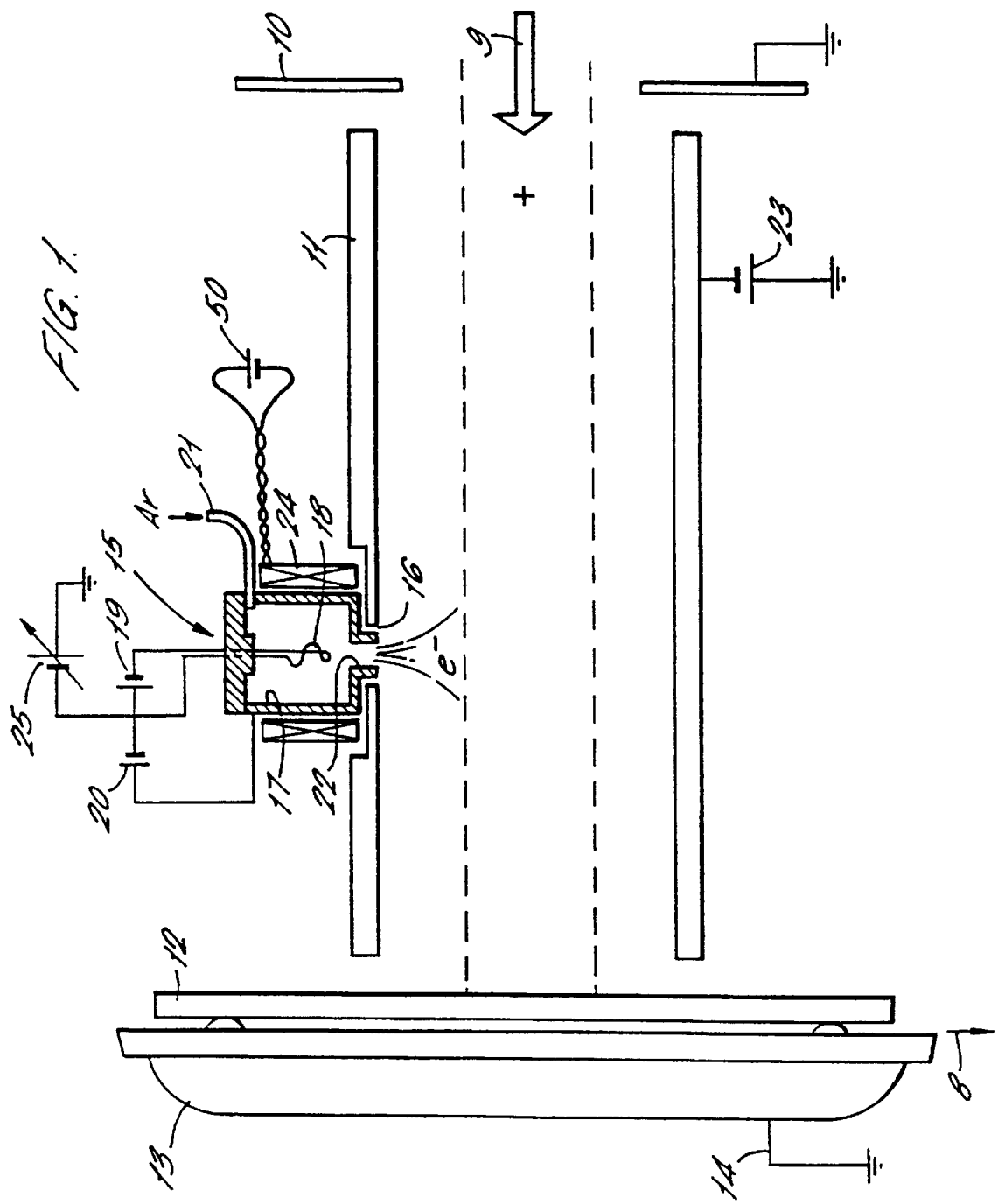
FIG. 1 is a schematic diagram of electron flood apparatus located in front of a wafer holder in ion implantation apparatus, and embodying the present invention.

Referring to the drawings, FIG. 1 illustrates schematically elements contained in the process chamber of an ion implantation apparatus. The process chamber is evacuated and the structure of the chamber itself is not shown in FIG. 1 for clarity. A beam 9 of positive ions for implantation in a semiconductor substrate enters the process chamber from the rest of the implantation apparatus through an aperture electrode 10, passes along the centre axis of a tube 11, and impinges on a wafer 12 held on a support 13. The wafer 12 is in electrical contact with the support 13 which is in turn connected to a substrate common terminal 14 which is in the present example connected to ground. The entrance aperture 10 is also connected to ground.

In a typical implantation apparatus, the support 13 may comprise one of several corresponding supports on a scanning wheel which is rotated about an axis, so that each support 13 scans the wafer 12 through the ion beam 9 (e.g. in the direction of arrow 8). At the same time, the axis of rotation of the scanning wheel may be reciprocated in a transverse direction, to provide a raster scanning effect of the ion beam 9 on the wafer 12. Further details of a typical scanning system as used in ion implantation apparatus can be derived from U.S. Pat. No. 4,733,091. The complete ion implantation apparatus also includes an ion source from which a beam of ions is extracted, and a mass analyser which uses a magnet to separate ions of different mass/charge ratios so that ions of a single desired mass are present in the beam 9 supplied to the process chamber. The energy of the ion beam 9 is controlled in accordance with the desired depth of implantation in the substrate 12 and may be as high as 150 keV or more, and as low as 1 or 2 keV or less for very shallow implants.

As illustrated in FIG. 1, an electron flood apparatus, indicated generally at 15 provides a flow of low energy electrons through an opening 16 in the side wall of the tube 11. These low energy electrons are attracted to the beam 9, which is typically at a small positive potential, and diffuse to the substrate 12, where they may be attracted to the substrate to neutralise any positive charge build up on the substrate during the implantation process.

The electron flood apparatus 15 comprises a plasma chamber 17 of electrically conducting material, containing a filament 18. The filament 18 is heated from a power source 19 and a so called arc voltage is supplied between the filament 18 and the chamber 17 by means of a supply 20, to accelerate electrons emitted by the filament. A supply of inert gas such as argon is provided to the plasma chamber 17 along a conduit 21. The interaction between the accelerated electrons from the filament 18 and the argon atoms in the plasma chamber produces a plasma, forming a rich supply of electrons to be emitted through an exit aperture 22 of the chamber 17, into the tube 11.

In this example, the tube 11 is itself held at a negative potential by a supply 23, so that the tube acts as a confinement tube tending to encourage electrons within the tube towards the beam 9 at the centre of the tube.

Magnet apparatus 24 is provided around the plasma chamber 17 to produce a magnetic field within the plasma chamber which is substantially aligned axially with the exit aperture 22 of the chamber. This magnetic field tends to confine the plasma within the chamber to the central region of the chamber, increasing the density of the plasma in this region and improving the efficiency of the production of electrons in the plasma.

As shown in FIG. 1, one end of the filament 18 is connected to ground via an adjustable power supply 25, which can be set to apply a desired negative potential to the filament relative to ground.

The operation of the electron flood apparatus is described in more detail with reference to the schematic drawings of FIGS. 2 and 3, in which components corresponding to those illustrated in FIG. 1 are identified by the same reference numerals.

Figure 2:
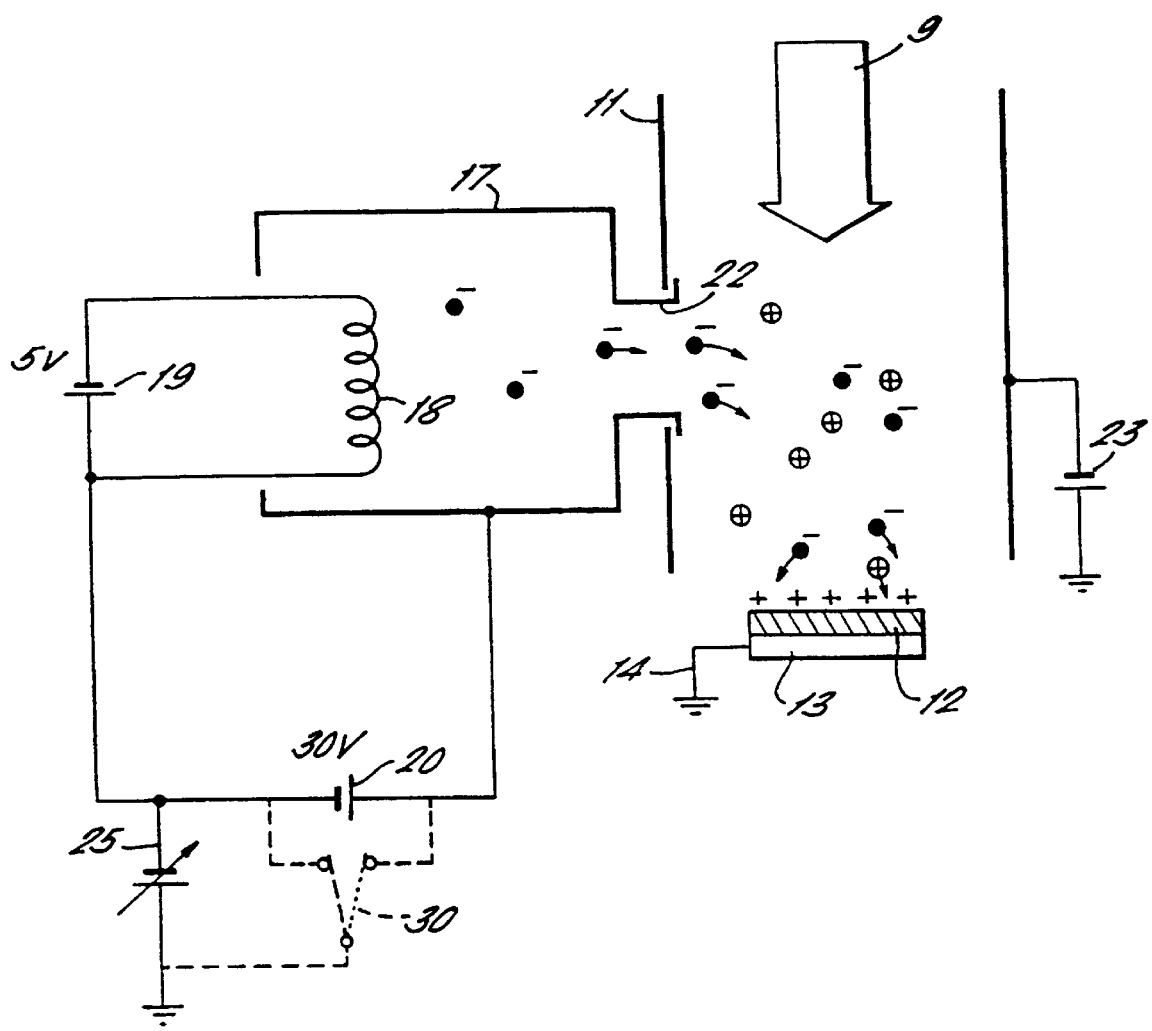
FIG. 2 is a more schematic representation of the embodiment of FIG. 1.
Figure 3:
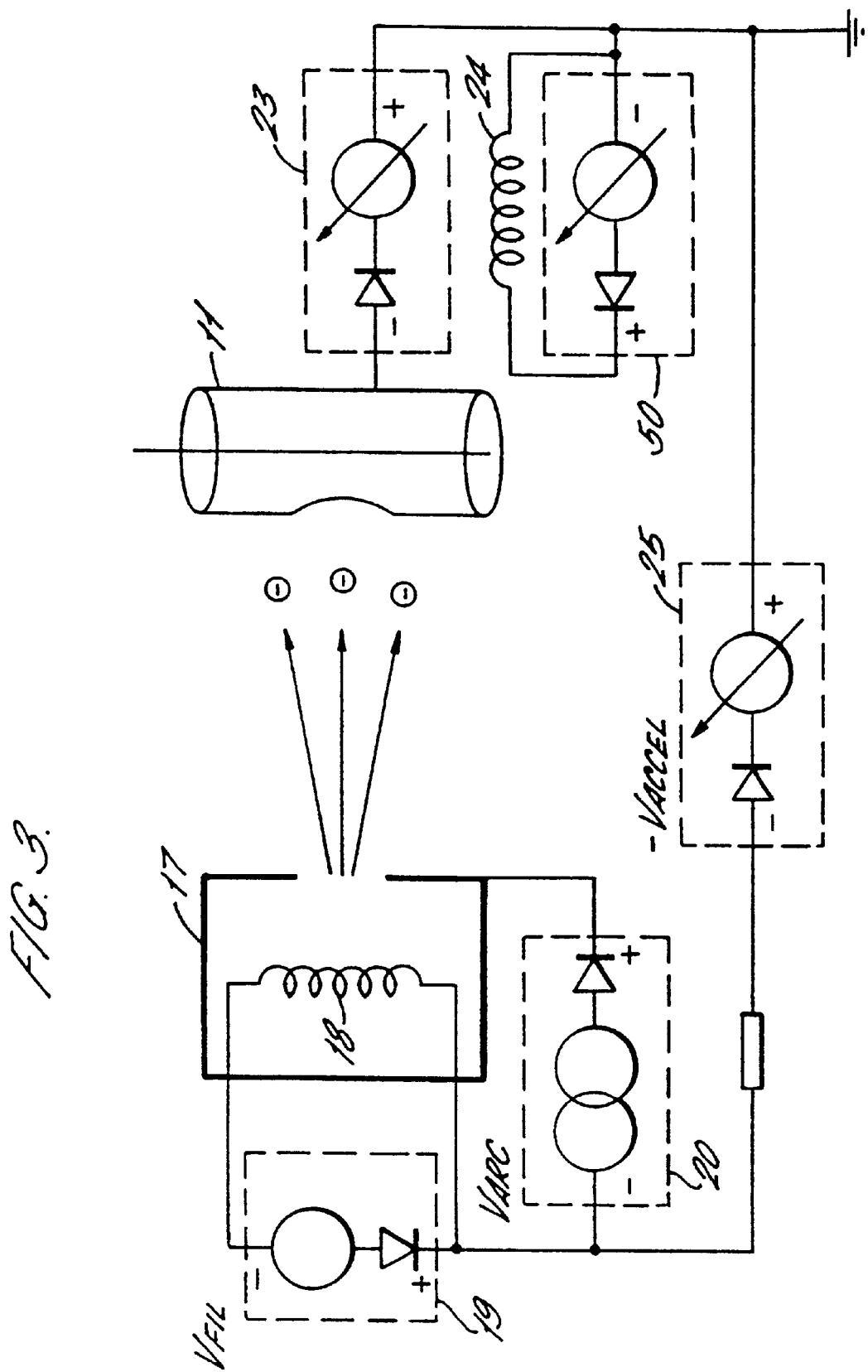
FIG. 3 is a further schematic representation of the embodiment, particularly illustrating the various power supply units.

Referring firstly to FIG. 2, the arc supply 20 which biases the filament relative to the plasma chamber 17 is shown having a typical value of 30 volts. In practice, this supply 20 may be a programmable power supply, adjustable to provide an output voltage of between 20 and 40 volts. The filament supply 19 may be a programmable power supply providing an output of between 0 and 5 volts. The supply 23 to the confinement tube 11 may also be a programmable power supply having an output adjustable between 0 and 30 volts. The filament bias supply 25 is also a programmable power supply adjustable between 0 and 30 volts.

Figure 4:
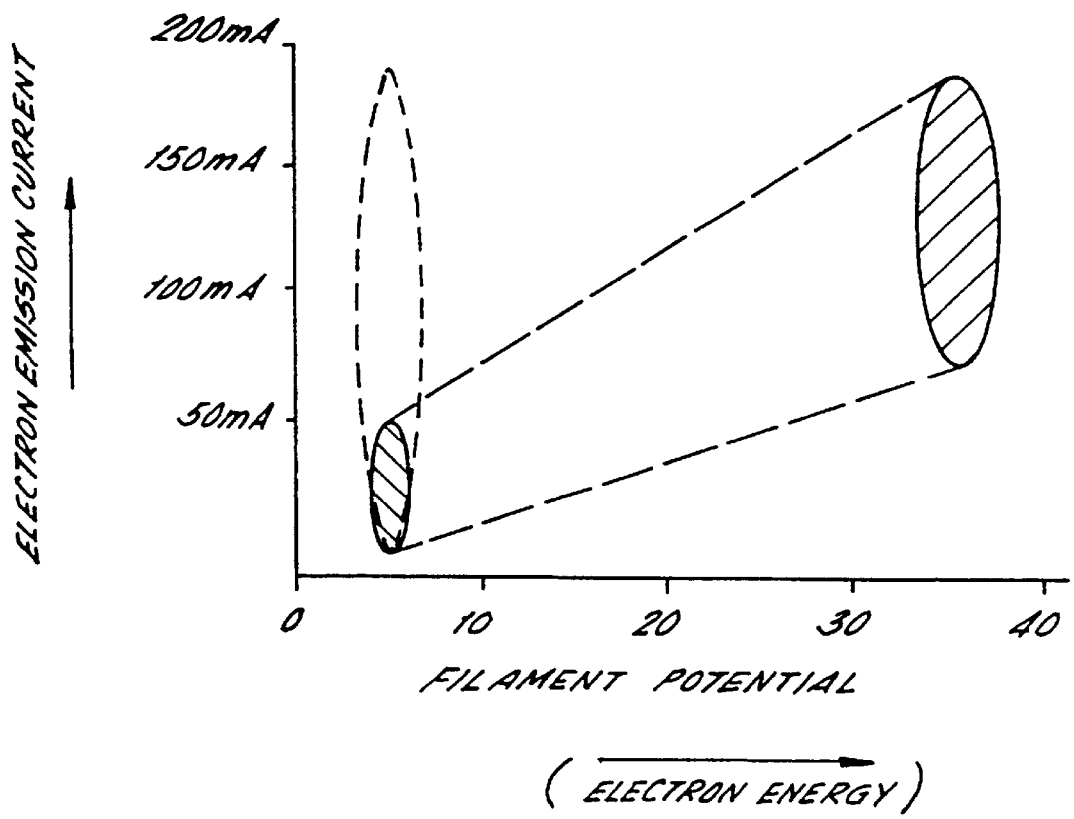
FIG. 4 is a graphical representation of the electron emission current from a flood apparatus against the filament potential.

The improved performance of the electron flood apparatus, incorporating the separate filament bias supply 25, is illustrated in FIG. 4. In prior art arrangements, as described above, instead of the supply 25, a switch 30 was provided which is switchable between a first mode in which the filament 18 is directly connected to ground, and a second mode in which the chamber 17 is directly connected to ground so that the filament is effectively biased to minus thirty volts (in the illustrated example). The switch 30 and the associated connections to ground are shown in dotted lines in FIG. 2.

The mode in which the filament 18 is connected directly to earth has been referred to as Accel/Decel mode because electrons emitted from the filament, or formed in the plasma adjacent the filament, are first accelerated to an energy corresponding to the potential difference between the filament and the plasma chamber 17 (30 volts in the illustrated example), and then decelerated to a very low energy again where the electrons leave the exit aperture 22 of the plasma chamber and enter the confinement tube 19.

In this mode, such electrons produced in the plasma chamber 17 which travel to the substrate 12 have a very low energy at the substrate, effectively equal to or less than 5 eV, corresponding to the potential relative to earth at one end of the filament 18. However, it has been observed that the flux of electrons into the confinement tube 11 provided by flood apparatus operating in this mode is also relatively low. This is illustrated in FIG. 4 by the region 40 which corresponds to the Accel/Decel mode in the prior art. As can be seen in FIG. 4, although the filament potential relative to ground, and hence the electron energy at the substrate is 5 eV or less in this mode, the current of electrons emitted from the flood apparatus may be less than 50 mA.

By comparison, in the prior art mode with the plasma chamber 17 connected to ground, referred to as the Bias Mode, electrons once accelerated in the plasma chamber to the energy of the bias between the filament 18 and the plasma chamber 17 are scarcely decelerated subsequently, and in fact arrive at the substrate 12 with energies up to 35 eV. However, in this mode, a much higher flux of electrons from the plasma chamber 17 is observed. This is illustrated by the region 41 in FIG. 4 for which electron emission currents to a few hundred mA have been observed in the prior art. However, with such higher electron energies at the substrate, there is a danger in some applications of excessive negative charge build up on certain regions of the substrate causing damage to the substrate.

With the provision of the additional filament bias power supply 25, the flood apparatus can be set to operate at any point in the region 42 between the regions 40 and 41 in FIG. 4. In this way, the plasma flood apparatus can be tailored to suit the requirements of a particular implant process, providing just sufficient electron flood current to ensure adequate neutralisation of positive charge build up on the substrate, without generating electrons of excessive energy at the substrate which could damage the substrate through excessive negative charge build up. As a result, with this additional power supply 25, the productivity of implanters can be substantially improved.

As mentioned previously, prior art plasma flood apparatus include magnet apparatus around the plasma chamber of the flood apparatus. In U.S. Pat. No. 5,399,871, an array of permanent magnets are located around the periphery of the plasma chamber, all arranged parallel to the axis of the exit aperture of the plasma chamber with like poles in one axial direction and opposite poles in the other axial direction. Referring again to FIG. 1, the described embodiment employs a solenoid 24 surrounding the plasma chamber 17, with the axis of the solenoid 24 coaxial with the axis of the exit aperture 22. The solenoid 24 is energised from a power supply 50 so as to produce a static magnetic field in the plasma chamber 17 having a flux density in a central part of the plasma chamber of about 350 gauss.

This use of a solenoid to produce a magnetic field in the plasma chamber provides surprising improvement in the electron emission current from the plasma chamber into the confinement tube 11. FIG. 4 shows a region 43 corresponding to the area of operation of the plasma flood apparatus using a solenoid magnet producing a central field of 350 gauss, for example, even when the electron flood apparatus is otherwise operating in the prior art Accel/Decel mode, with the filament 18 connected directly to ground. Thus, with the solenoid magnet, electron emission currents of several hundred mA are achieved with electron energies at the substrate less than or equal to 5 eV.

This improvement in performance is not explained solely by any increase in the strength of the magnetic field in the central region of the plasma chamber, when produced by the solenoid 24. It is believe that an important additional factor results from the shape of the magnetic field produced by the solenoid, compared with the field produced by the array of permanent magnets used in the prior art.

With the previously used permanent magnets, the resulting magnetic field had a cusp of very low or zero magnetic field at or very close to the centre of the exit aperture 22 from the plasma chamber 17. Thus, although the prior art permanent magnets effectively compress the plasma within the plasma chamber 17, the magnetic field produced by these permanent magnets was less effective in "guiding" electrons out through the exit aperture into the confinement tube 11 to merge with the beam 9.

By comparison, the magnetic field produced by the solenoid 24 has no such cusp and the field lines extend right through the exit aperture 22 so that electrons from within the plasma chamber 17 can be confined to helical paths around the magnetic field lines and so be guided thereby from the interior of the plasma chamber through the exit aperture 22 to merge with the beam plasma within the confinement tube 11.

As mentioned above, relatively high electron emission currents can be achieved using the solenoid magnet 24 even with no bias, relative to the grounded substrate, applied to the filament 18. If a negative bias is additionally applied to the filament by means of the power supply 25, very high emission currents can be achieved, albeit with some increase in electron energy at the substrate.

What is claimed is:

1. Electron flood apparatus for neutralising positive charge build up on a substrate during implantation of ions in the substrate by ion implantation apparatus, the substrate being connected to a common terminal, the electron flood apparatus comprising:

a tube for axially receiving and passing an ion beam to a substrate, an opening in a side wall of the tube, a plasma chamber having an exit aperture in communication with said opening of said tube, a supply of inert gas to said plasma chamber, a cathode in said plasma chamber, a cathode power supply connected to heat said cathode to emit electrons, said plasma chamber providing an accelerating electrode within said chamber, an accelerating electrical supply connected to provide an accelerating potential between said cathode and said accelerating electrode to accelerate electrons emitted by said cathode to produce a plasma in said chamber, and a cathode bias electrical supply for connection directly between said cathode and said substrate common terminal to set a desired bias potential on said cathode relative to said substrate independently of said accelerating potential.

2. Apparatus as claimed in claim 1, wherein said cathode bias supply is adjustable to set a value of said desired cathode bias potential between zero and minus fifty volts.

3. Apparatus as claimed in claim 2, wherein said cathode bias supply is adjustable between zero and minus thirty volts.

4. Apparatus as claimed in claim 1 wherein said accelerating supply is adjustable to set a value for said accelerating potential between twenty and forty volts.

5. Apparatus as claimed in claim 1 including a tube bias electrical supply for connection between said tube and said substrate common terminal to set a desired bias potential on said tube relative to said substrate.

6. Apparatus as claimed in claim 5, wherein said tube bias supply is adjustable to set a value of said desired tube bias potential between zero and minus thirty volts.

7. Apparatus as claimed in claim 1 wherein said cathode comprises a filament and said cathode power supply is a filament power supply connected across said filament.

8. Apparatus as claimed in claim 1 and including magnet apparatus to produce a magnetic field in said plasma chamber having field lines in a central region of said chamber aligned with said exit aperture to increase the density of plasma in said chamber and promote the flow of electrons from said chamber through said exit aperture.

9. Apparatus as claimed in claim 8 wherein said magnet apparatus comprises a solenoid coil surrounding said plasma chamber coaxially with said exit aperture and a solenoid power supply to energise said coil to produce said magnetic field.

* * * * *